(12) United States Patent
Pagh

(10) Patent No.: US 12,175,383 B2
(45) Date of Patent: Dec. 24, 2024

(54) SYSTEMS AND METHODS FOR COMPRESSING FLOATING POINT TENSORS

(71) Applicant: Google LLC, Mountain View, CA (US)

(72) Inventor: Rasmus Pagh, Hjarup (SE)

(73) Assignee: GOOGLE LLC, Mountain View, CA (US)

( * ) Notice: Subject to any disclaimer, the term of this patent is extended or adjusted under 35 U.S.C. 154(b) by 895 days.

(21) Appl. No.: 17/320,924

(22) Filed: May 14, 2021

(65) Prior Publication Data

US 2021/0357789 A1 Nov. 18, 2021

Related U.S. Application Data

(60) Provisional application No. 63/025,596, filed on May 15, 2020.

(51) Int. Cl.
| | | |
|---|---|---|
| *G06N 5/04* | (2023.01) | |
| *G06N 20/00* | (2019.01) | |
| *H03M 7/24* | (2006.01) | |
| *H03M 7/30* | (2006.01) | |

(52) U.S. Cl.
CPC ............ *G06N 5/04* (2013.01); *G06N 20/00* (2019.01); *H03M 7/24* (2013.01); *H03M 7/3066* (2013.01)

(58) Field of Classification Search
CPC ........... G06N 5/04; G06N 20/00; H03M 7/24; H03M 7/3066
See application file for complete search history.

(56) References Cited

U.S. PATENT DOCUMENTS 6,737,997 B2 * 5/2004 Sakaguchi .............. H03M 7/30
341/83
11,216,275 B1 * 1/2022 James-Roxby ......... G06F 5/012

OTHER PUBLICATIONS

Courbariaux et al., "Training Deep Neural Networks with Low Precision Multiplications", arXiv:1412.7024v5, Sep. 23, 2015, 10 pages.

(Continued)

*Primary Examiner* — Khai M Nguyen
(74) *Attorney, Agent, or Firm* — DORITY & MANNING P.A.

(57) ABSTRACT

A computer-implemented method of compressing floating point data of a machine-learned model into a compressed representation of the floating point data can include obtaining floating point data including a plurality of machine-learned model parameters encoded as a tensor, determining a sign vector including a sign bit of each of the plurality of machine-learned model parameters, determining a normalization exponent based on the floating point data, determining a plurality of offsets descriptive of a difference between an exponent of the machine-learned model parameters and the normalization exponent, determining a bitmap including a unary representation of the plurality of offsets, determining a plurality of adjusted mantissas based at least in part on the plurality of offsets, and storing a compressed representation of the floating point data, the compressed representation including the sign vector, the normalization exponent, the bitmap, and one or more bits of each of the plurality of adjusted mantissas.

20 Claims, 8 Drawing Sheets

(56) References Cited

OTHER PUBLICATIONS

Koster et al., "Flexpoint: An Adaptive Numerical Format for Efficient Training of Deep Neural Networks", 2017 Conference on Neural Information Processing Systems, Dec. 4-9, 2017, 11 pages.
Liguori et al., "Pyramid Vector Quantization for Deep Learning", arXiv:1704.02681v1, Apr. 10, 2017, 9 pages.
Qureshi et al., "A hardware processor for implementing the pyramid vector quantizer", IEEE Transactions on Acoustics, Speech, and Signal Processing, vol. 37, No. 4, Jul. 1989, pp. 1135-1142.
Rouhani et al., "Pushing the Limits of Narrow Precision Inferencing at Cloud Scale with Microsoft Floating Point", 2020 Conference on Neural Information Processing Systems, Dec. 6-12, 2020, Virtual, 11 pages.
Uzan et al., "Stationary log-normal distribution of weights stems from spontaneous ordering in adaptive node networks", Scientific Reports, vol. 8, Aug. 2018, 9 pages.

\* cited by examiner

SYSTEMS AND METHODS FOR COMPRESSING FLOATING POINT TENSORS

CROSS REFERENCE TO RELATED APPLICATIONS

The present application claims filing benefit of U.S. Provisional Patent Application Ser. No. 63/025,596 having a filing date of Mar. 15, 2020, which is incorporated herein by reference in its entirety.

FIELD

The present disclosure relates generally to systems and methods for compression of floating point data. In particular, the present disclosure relates to compression of floating point data that includes a large degree in variance of magnitude such as, for example, floating point data that encodes machine-learned model parameter values.

BACKGROUND

Information stored in computing systems can be stored as data in memory. For example, information can be stored as "bits" of data, where each bit equals 1 or 0. It can be desirable to reduce the amount of data and/or memory used to store information (e.g., reduce the number of bits required to store the data). Techniques for reducing memory usage to store information are often referred to as compression techniques. Floating point data can represent real numbers as a combination of a sign component, exponent component, and mantissa components.

Machine-learned models refer to a class of mathematical models that are trained based on a set of training data to learn parameters for the model based on training data. For instance, the trained model can be used to infer features of new data based on the structure learned from the training data.

SUMMARY

Aspects and advantages of embodiments of the present disclosure will be set forth in part in the following description, or can be learned from the description, or can be learned through practice of the embodiments.

One example aspect of the present disclosure is directed to a computer-implemented method of compressing floating point data of a machine-learned model into a compressed representation of the floating point data. The computer-implemented method can include obtaining, by a computing system including one or more computing devices, floating point data including a plurality of machine-learned model parameters encoded as a tensor. The computer-implemented method can include determining, by the one or more computing devices, a sign vector including a sign bit of each of the plurality of machine-learned model parameters. The computer-implemented method can include determining, by the one or more computing devices, a normalization exponent based on the floating point data. The computer-implemented method can include determining, by the one or more computing devices, a plurality of offsets, the offsets being descriptive of a difference between an exponent of the plurality of machine-learned model parameters and the normalization exponent. The computer-implemented method can include determining, by the one or more computing devices, a bitmap including a unary representation of the plurality of offsets. The computer-implemented method can include determining, by the one or more computing devices, a plurality of adjusted mantissas based at least in part on the plurality of offsets. The computer-implemented method can include storing, in a memory of the computing system, a compressed representation of the floating point data, the compressed representation including the sign vector, the normalization exponent, the bitmap, and one or more bits of each of the plurality of adjusted mantissas.

Another example aspect of the present disclosure is directed to a computer-implemented method of decompressing floating point data from a compressed representation of the floating point data. The computer-implemented method can include receiving, by a computing system comprising one or more computing devices, a compressed representation of floating point data including a sign vector, a normalization exponent, a bitmap comprising a plurality of offsets, and one or more bits of each of a plurality of adjusted mantissas. The computer-implemented method can include determining, by the computing system and based on the plurality of offsets and the one or more bits of each of a plurality of adjusted mantissas, a plurality of approximated mantissas. The computer-implemented method can include determining, by the computing system and based on the normalization exponent and the plurality of offsets, a plurality of exponents.

Another example aspect of the present disclosure is directed to a computing system configured to compress floating point data. The computing system can include one or more processors and one or more non-transitory computer-readable media that store instructions that, when executed by the one or more processors, cause the computing system to perform operations. The operations can include obtaining, by a computing system including one or more computing devices, floating point data including a plurality of machine-learned model parameters encoded as a tensor. The operations can include determining, by the one or more computing devices, a sign vector including a sign bit of each of the plurality of machine-learned model parameters. The operations can include determining, by the one or more computing devices, a normalization exponent based on the floating point data. The operations can include determining, by the one or more computing devices, a plurality of offsets, the offsets being descriptive of a difference between an exponent of a plurality of exponents respective to the plurality of machine-learned model parameters and a respective machine-learned model parameter of the plurality of machine-learned model parameters and the normalization exponent. The operations can include determining, by the one or more computing devices, a bitmap including a unary representation of the plurality of offsets. The operations can include determining, by the one or more computing devices, a plurality of adjusted mantissas based at least in part on the plurality of offsets. The operations can include storing, in a memory of the computing system, a compressed representation of the floating point data, the compressed representation including the sign vector, the normalization exponent, the bitmap, and one or more bits of each of the plurality of adjusted mantissas.

Other aspects of the present disclosure are directed to various systems, apparatuses, non-transitory computer-readable media, user interfaces, and electronic devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which makes reference to the appended figures, in which.

Figure 1A:
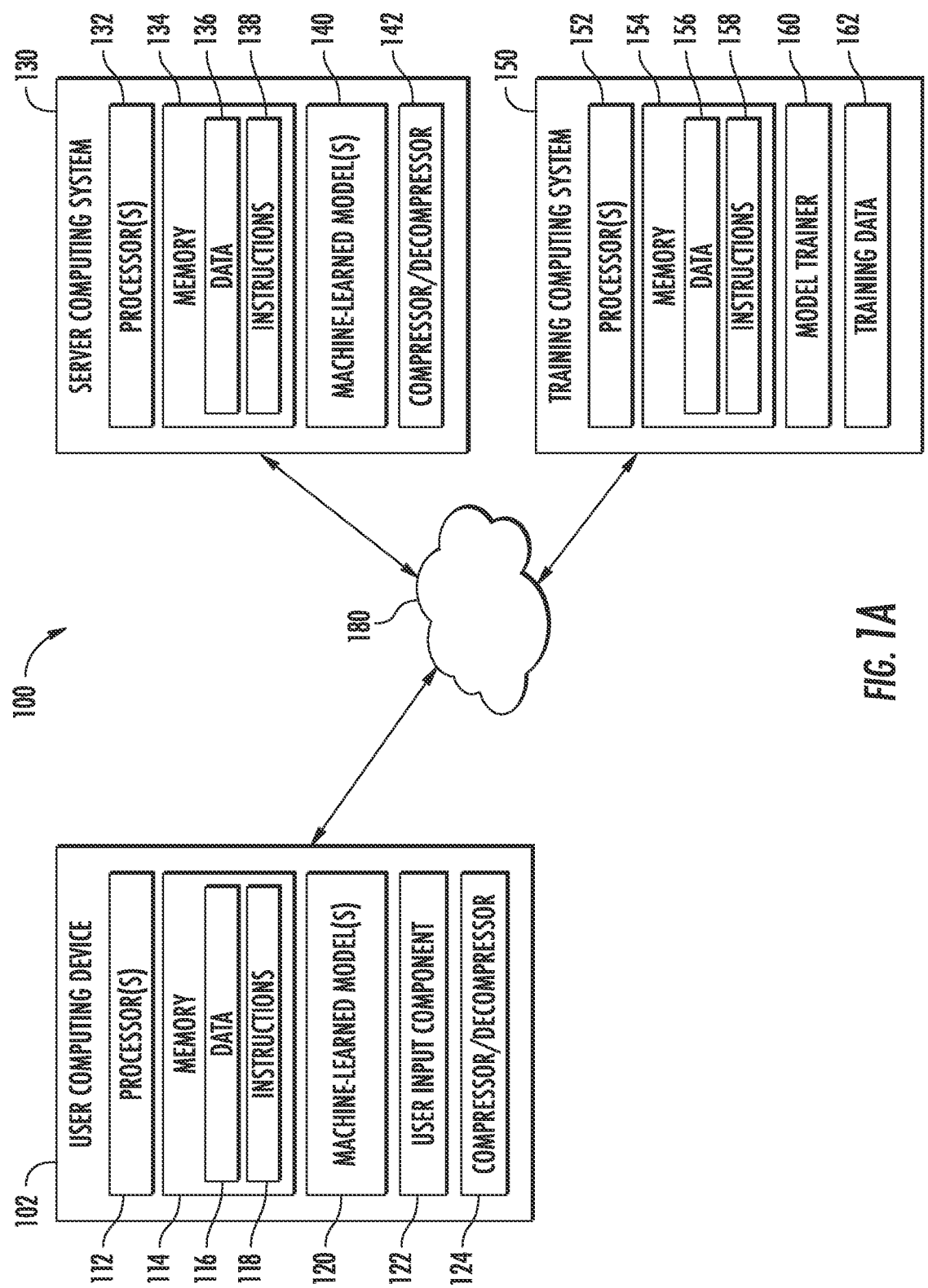
FIG. 1A depicts a block diagram of an example computing system according to example embodiments of the present disclosure.

Reference numerals that are repeated across plural figures are intended to identify the same features in various implementations.

DETAILED DESCRIPTION

Reference now will be made in detail to embodiments, one or more example(s) of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to a computer-implemented method of compressing floating point data into a compressed representation of the floating point data. It can be desirable to use compression techniques to store and/or transmit a data set having a large size, such as a data set having a large number of data items and/or a large number of numerals per data item. As one example, machine-learned models can be represented using tensors having a large number of model parameter values, such as respective values for millions of model parameters. Stated differently, parameters of machine-learned models can be represented as tensors (e.g., vectors) having a large number (e.g., millions) of component values.

The model parameters can include training-time parameters, such as structural parameters (e.g., weights, activations, etc.) of an untrained or partially trained model. Additionally and/or alternatively, the model parameters can include inference-time parameters, such as structural parameters (e.g., weights, activations, etc.) of a deployed model (e.g., fully trained and/or continually training), inference data (e.g., input data and/or output data), and/or any other suitable parameters. For instance, during a training stage, it can be necessary to transmit parameter updates and/or structural parameters Some existing compression schemes can experience shortcomings in compressing floating point data having a high degree of variability in magnitude (e.g., having entries with exponents that differ by more than about two bits (e.g., about four)). For instance, some existing compression schemes can have a high dynamic range, but may experience tradeoffs with accuracy (e.g., may use only a limited number of bits for a mantissa). As another example, some existing compression schemes can achieve high degrees of compression and/or accuracy, but may be limited in a range of representable data. Similarly, some schemes may enable compression of highly variable data, but may achieve limited compression of the highly variable data. As one example, some compression schemes can compress floating point data such that a single exponent is shared by the compressed data, which can increase a number of bits required for a mantissa to represent an entry if the magnitude of the entry differs greatly from the exponent. For example, if some entry has a large magnitude (e.g., relative to the length of the vector) the precision can be considerably lower than what is theoretically possible. These challenges can complicate compression and/or transmission of some floating point data.

These problems can be apparent, for instance, in parameter values of a machine-learned model. As one example, machine-learned model parameters can include a heavy-tailed distribution of data wherein most parameters have relatively similar values and a few parameters have outlying values. For instance, the machine-learned model parameters can follow a lognormal distribution. Existing compression techniques can especially encounter difficulties on such heavy-tailed floating point data. For instance, some compression techniques that may even achieve near-optimal compression for low-variability data can have a rounding error per entry of up to a factor roughly $\sqrt{d}$, where d is the dimension of the vector, larger than an optimal compression. As one example, The worst-case L1 error of some existing quantization methods can be about the $\min(\|x\|_1, d*2^{1-b}*\|x\|_\infty)$, where $\|x\|_\infty$ is the $L_\infty$ norm and b is a number of compressed bits per entry, in the case where all vector entries have roughly the same size so that $\|x\|_1 \cong d*\|x\|_\infty$. If the distribution is skewed or has a high degree of variability (e.g., a lognormal distribution), however, then the L1 error may be up to about d times larger, and the L2 error may be up to about $\sqrt{d}$ times larger.

An additional challenge in floating point data compression is implementation feasibility in hardware. For instance, some theoretical compression schemes (e.g., pyramid compression) can achieve good compressibility and accuracy on floating point data having a high degree of variability in magnitude, but may be too complicated and/or otherwise unsuitable to feasibly implement in hardware. As one example, computer hardware can generally be suited for synchronized and/or repeatable operations, such as vector operations, register shifting (e.g., bit shifting), etc. Some algorithms can utilize operations that may be challenging for a computer to perform (e.g., require specialized hardware and/or perform slowly on standard hardware). Thus, an additional consideration for compression schemes can be how hardware-implementable the compression scheme is.

Aspects of the present disclosure can provide compression techniques that achieve a number of technical effects and benefits and improvements to computing technology. For instance, compression techniques according to example aspects of the present disclosure can provide improved tradeoffs between compressibility, accuracy, and range, while remaining feasibly implementable in hardware. As one example, the systems and methods described herein can reduce floating point data having 32 bits per entry to about 10 bits per entry. Furthermore, although compression techniques according to example aspects of the present disclosure can be applied to and, in some cases, achieve desirable levels of compression for all types of floating point data, the compression techniques described herein can especially provide improvements in tradeoffs between compressibility, accuracy, and range for floating point data having a high degree of variability (e.g., data with a skewed distribution). Furthermore, in some instances, hardware support can be simplified to include implementing mappings between floating point vectors and compressed data according to example aspects of the present disclosure. In this manner, the compression techniques described herein can be easily implementable on standard computer hardware, in some embodiments.

Aspects of the present disclosure can especially be beneficial for compression of machine-learned models during a training stage (e.g., to capture structural parameters and/or parameter updates). However, some more efficient compression techniques may exist for floating point data having little to no variability in magnitude. For example, it is contemplated that some compression techniques may achieve greater accuracy for nearly-similar floating point entries (e.g., having about a constant exponent for each entry). Despite this, aspects of the present disclosure can be applied to any suitable data, such as any suitable floating point data, including floating point data having a low degree of variability.

According to example aspects of the present disclosure, a computer-implemented method of compressing floating point data into a compact representation of the floating point data can include obtaining, by a computing system including one or more computing devices, floating point data. The floating point data can have a plurality of entries. For instance, the floating point data can be a vector or tensor. In some embodiments, the floating point data can be or can include a heavy-tailed distribution of data, such as a log-normal distribution.

The floating point data can include a sign component (e.g., a sign bit), an exponent component (e.g., one or more exponent bits), and a mantissa component, also called a significand component (e.g., one or more mantissa bits). As one example, let $x=(x_1, x_2, \ldots, x_d)$ be a vector of entries $x_i$, the vector having a dimension d. Additionally, the floating point data can be a tensor having a plurality of vectors, each having a length dimension d.

A value of the sign component (e.g., a sign bit) can be indicative of a positive or negative status of an entry. For instance, in some embodiments, a value of 0 can be indicative of a positive entry, and a value of 1 can be indicative of a negative entry. A value of the exponent component (e.g., one or more exponent bits) can be a base-2 representation of an integer $e_i$ such that $|x| \leq 2^{e_i}$. A value of the mantissa component (e.g., one or more mantissa bits) can be a base-2 representation of the number $m_i$ such that $$m_i = \frac{|x_i|}{2^{e_i}}.$$

For instance, the mantissa component can represent the magnitude of the entry when divided by the exponent to fall in the range [0, 1). According to example aspects of the present disclosure, the floating point data x can be compressed to within b bits per entry (e.g., b*d bits), where b is a number greater than or equal to 4.

According to example aspects of the present disclosure, the method can include storing, in a memory of the computing system, a sign vector including a sign bit of each of the plurality of entries. For instance, for each entry $x_i$, a sign bit $s_i$ can be stored in a sign vector having length d, where each bit of the sign vector corresponds to the sign of the entry at that bit position. Thus, the sign bit can be one of the b bits for each entry.

According to example aspects of the present disclosure, the method can include determining, by the one or more computing devices, a normalization factor based on the floating point data. For example, in some embodiments, the normalization factor can be or can include a norm, such as an L1 norm (also called a "Manhattan" norm). In some embodiments, the normalization factor can be or can include a normalization exponent such that two multiplied by an exponential sum with base two over a plurality of exponents respective to the plurality of machine-learned model parameters is less than or equal to a dimension of the tensor multiplied by two to the power of the normalization exponent. In some implementations, the normalization factor can be or can include a normalization exponent such that two multiplied by an exponential sum with base two over a plurality of exponents respective to the plurality of machine-learned model parameters is less than or equal to a dimension of the tensor multiplied by two to the power of the normalization exponent. For example, the normalization exponent k can be defined such that $2\Sigma_i 2^{e_i} \leq d*2^k$, where $e_i$ is an exponent of an ith machine-learned model parameter and d is a length dimension of the tensor.

According to example aspects of the present disclosure, the method can include storing, in the memory, the normalization factor. For example, the normalization factor can be stored in addition to the compressed data for each entry. Including an L1 norm and/or the normalization exponent k as the normalization factor can be beneficial, as these integer values can require fewer bits to store (e.g., than other types of data, such as floating point numbers) while achieving high precision.

According to example aspects of the present disclosure, the method can include normalizing, by the one or more computing devices, the floating point data by a normalization process to obtain a plurality of normalized entries. As one example, the normalization process can include performing L1 normalization on the floating point data to obtain a plurality of L1 normalized entries.

As another example, the normalization process can be an approximate L1 normalization process that can include determining the normalization factor as the normalization exponent k (e.g., a smallest exponent) such that two multiplied by an exponential sum with base two over a plurality of exponents respective to the plurality of machine-learned model parameters is less than or equal to a dimension of the tensor multiplied by two to the power of the normalization exponent (e.g., $2\Sigma_i 2^{e_i} \leq d*2^k$). This can result in $d \cdot 2^k$ being between 1 and 2 times the L1 norm of x. Additionally, this can result in the L1 norm of x being between 0.5 and 1. Additionally and/or alternatively, the approximate L1 normalization process can include determining, for each entry of the plurality of entries and by the one or more computing devices, an offset for each entry. The offset can be descriptive of a difference between the normalization exponent k and the exponent of the entry. For instance, the offsets of can be the maximum of 0 and ei−k. Thus, the offsets can encode how much ei exceeds k. In some cases, negative offsets can be rounded up to zero. This may result in a small loss of precision, but may prevent having to store sign bits associated with the offsets. Additionally and/or alternatively, the approximate L1 normalization process can include determining a plurality of adjusted mantissas based on the offsets. For instance, the adjusted mantissas can be the mantissa of each entry divided by two to the power of the offset for the entry, wherein the offset is positive, or the entry, wherein the offset is negative. For example, adjusted mantissas $n_i = m_i / 2^{max(0, k-e_i)}$ can be computed such that $x_i = s_i * 2^{(k+o_i)} * n_i$. The adjusted mantissas can, in some embodiments, be computed by bit shifting, which can be an easily implementable operation in hardware. In this approximate L1 normalization process, the offsets can be used in place of the exponents (e.g., encoded in a concatenated unary representation having 2*d bits).

According to example aspects of the present disclosure, the method can include determining, by the one or more computing devices, a bitmap representative of a plurality of exponents for each of the plurality of entries, wherein the bitmap comprises a unary representation of the plurality of exponents. For instance, in some embodiments, the bitmap can be a unary representation of the plurality of exponents of the normalized entries. In some embodiments, the bitmap can be a unary representation of the offsets. In some embodiments, the bitmap can have two bits per entry (e.g, 2*d bits in total). For example, the bitmap can be an ordered concatenation of unary representations (e.g., two-bit unary representations) of each of the exponents and/or offsets. For instance, in some cases, the number of entries i with $e_i \geq j$ is at most d/2*j, so the sum of all $e_i$ can be bounded by. According to example aspects of the present disclosure, the method can include storing, in the memory, the bitmap. For instance, the bitmap can be stored as part of the compressed data representative of the original entries.

According to example aspects of the present disclosure, the method can include storing, in the memory, a subset of bits of each of the plurality of normalized entries. For example, the subset of bits can include a number of bits such that each entry is represented by b bits. As one example, such as in implementations where the sign vector includes one bit per entry and the bitmap includes two bits for each entry, the subset can have b−3 bits for each entry (e.g., the b−3 most significant bits). As another example, such as in implementations where an approximate L1 normalization process is used to determine the plurality of normalized entries, the subset can have b−4 bits for each entry (e.g., the b−4 most significant bits).

In some implementations, if $e_i > 0$, $m_i$ is in the interval [½, 1). In these cases, the most significant bit is known and does not need to be stored. Thus, in these cases, an extra bit of precision can be achieved by instead storing a lower significance bit instead of the most significant bit. For instance, the method can include, for each of the plurality of machine-learned model parameters, determining, by the one or more computing devices, that the parameter comprises an exponent greater than zero, and, in response to determining that the parameter comprises an exponent greater than zero, storing an additional bit in place of a most significant bit of the parameter in the compressed representation.

In some embodiments, the method can include transmitting, by the one or more computing devices, compressed data stored in the memory and at least partially representative of the floating point data. For example, the method can include transmitting the sign vector, normalization factor (e.g., L1 norm), bitmap, and/or subset of bits in the compressed representation of the floating point data. As one example, the data can be transmitted from a first computing device to a second computing device. As another example, the data can be transmitted within a computing system (e.g., from a first memory device to a second memory device). Transmitting the compressed data can require fewer computing resources than transmitting the uncompressed vector.

Thus, in some implementations, the compressed representation of x can include the L1 norm of x. Additionally and/or alternatively, the compressed representation of x can include the sign vector. Additionally and/or alternatively, the compressed representation of x can include a unary encoding of the exponents as the bitmap (e.g., a unary encoding with about two bits per entry). Additionally and/or alternatively, the compressed representation of x can include a subset of the bits of each of the normalized entries (e.g., the mantissas of the normalized entries).

Additionally and/or alternatively, in some implementations, the compressed representation of x can include the exponent k (e.g., encoded as an integer) as the normalization factor. Additionally and/or alternatively, the representation of x can include the offsets $o_1, \ldots, o_d$ (e.g., encoded as a unary representation having 2*d total bits) as the bitmap. Additionally and/or alternatively, the representation of x can include the b−4 most significant bits of each of the adjusted mantissas $n_1, \ldots, n_d$. This encoding can be particularly simple to convert to a floating point representation. This can allow for standard circuits typically used for floating point arithmetic to be used to perform computations on vectors in this format.

In some implementations, an interval of values with the same representation can be represented by the middle point of the interval. This can improve average and/or worst case precision, in some cases.

As used herein, the word "about" in conjunction with a stated numerical value is intended to refer to within 20% of the stated numerical value, or a smallest possible integer variation (e.g., +/−1) of the stated numerical value.

With reference now to the Figures, example embodiments of the present disclosure will be discussed in further detail.

Example Devices and Systems

FIG. 1A depicts a block diagram of an example computing system 100 according to example embodiments of the present disclosure. The system 100 includes a user computing device 102, a server computing system 130, and a training computing system 150 that are communicatively coupled over a network 180.

The user computing device 102 can be any type of computing device, such as, for example, a personal computing device (e.g., laptop or desktop), a mobile computing device (e.g., smartphone or tablet), a gaming console or controller, a wearable computing device, an embedded computing device, or any other type of computing device.

The user computing device 102 includes one or more processors 112 and a memory 114. The one or more processors 112 can be any suitable processing device (e.g., a processor core, a microprocessor, an ASIC, a FPGA, a controller, a microcontroller, etc.) and can be one processor or a plurality of processors that are operatively connected. The memory 114 can include one or more non-transitory computer-readable storage mediums, such as RAM, ROM, EEPROM, EPROM, flash memory devices, magnetic disks, etc., and combinations thereof. The memory 114 can store data 116 and instructions 118 which are executed by the processor 112 to cause the user computing device 102 to perform operations.

In some implementations, the user computing device 102 can store or include one or more models 120. For example, the models 120 can be or can otherwise include various machine-learned models such as neural networks (e.g., deep neural networks) or other types of machine-learned models, including non-linear models and/or linear models. Neural networks can include feed-forward neural networks, recurrent neural networks (e.g., long short-term memory recurrent neural networks), convolutional neural networks or other forms of neural networks. Example models 120 are discussed with reference to FIG. 2.

In some implementations, the one or more models 120 can be received from the server computing system 130 over network 180, stored in the user computing device memory 114, and then used or otherwise implemented by the one or more processors 112. In some implementations, the user computing device 102 can implement multiple parallel instances of a single model 120.

Additionally or alternatively, one or more models 140 can be included in or otherwise stored and implemented by the server computing system 130 that communicates with the user computing device 102 according to a client-server relationship. For example, the models 140 can be implemented by the server computing system 130 as a portion of a web service. Thus, one or more models 120 can be stored and implemented at the user computing device 102 and/or one or more models 140 can be stored and implemented at the server computing system 130. The models 120 can be compressed and/or decompressed (e.g., according to example aspects of the present disclosure) by compressors/decompressors 124. The models 140 can be compressed and/or decompressed (e.g., according to example aspects of the present disclosure) by compressors/decompressors 142.

The user computing device 102 can also include one or more user input component 122 that receives user input. For example, the user input component 122 can be a touch-sensitive component (e.g., a touch-sensitive display screen or a touch pad) that is sensitive to the touch of a user input object (e.g., a finger or a stylus). The touch-sensitive component can serve to implement a virtual keyboard. Other example user input components include a microphone, a traditional keyboard, or other means by which a user can provide user input.

The server computing system 130 includes one or more processors 132 and a memory 134. The one or more processors 132 can be any suitable processing device (e.g., a processor core, a microprocessor, an ASIC, a FPGA, a controller, a microcontroller, etc.) and can be one processor or a plurality of processors that are operatively connected. The memory 134 can include one or more non-transitory computer-readable storage mediums, such as RAM, ROM, EEPROM, EPROM, flash memory devices, magnetic disks, etc., and combinations thereof. The memory 134 can store data 136 and instructions 138 which are executed by the processor 132 to cause the server computing system 130 to perform operations.

In some implementations, the server computing system 130 includes or is otherwise implemented by one or more server computing devices. In instances in which the server computing system 130 includes plural server computing devices, such server computing devices can operate according to sequential computing architectures, parallel computing architectures, or some combination thereof.

As described above, the server computing system 130 can store or otherwise include one or more machine-learned models 140. For example, the models 140 can be or can otherwise include various machine-learned models. Example machine-learned models include neural networks or other multi-layer non-linear models. Example neural networks include feed forward neural networks, deep neural networks, recurrent neural networks, and convolutional neural networks. Example models 140 are discussed with reference to FIG. 2.

The user computing device 102 and/or the server computing system 130 can train the models 120 and/or 140 via interaction with the training computing system 150 that is communicatively coupled over the network 180. The training computing system 150 can be separate from the server computing system 130 or can be a portion of the server computing system 130.

The training computing system 150 includes one or more processors 152 and a memory 154. The one or more processors 152 can be any suitable processing device (e.g., a processor core, a microprocessor, an ASIC, a FPGA, a controller, a microcontroller, etc.) and can be one processor or a plurality of processors that are operatively connected. The memory 154 can include one or more non-transitory computer-readable storage mediums, such as RAM, ROM, EEPROM, EPROM, flash memory devices, magnetic disks, etc., and combinations thereof. The memory 154 can store data 156 and instructions 158 which are executed by the processor 152 to cause the training computing system 150 to perform operations. In some implementations, the training computing system 150 includes or is otherwise implemented by one or more server computing devices.

The training computing system 150 can include a model trainer 160 that trains the machine-learned models 120 and/or 140 stored at the user computing device 102 and/or the server computing system 130 using various training or learning techniques, such as, for example, backwards propagation of errors. In some implementations, performing backwards propagation of errors can include performing truncated backpropagation through time. The model trainer 160 can perform a number of generalization techniques (e.g., weight decays, dropouts, etc.) to improve the generalization capability of the models being trained.

In particular, the model trainer 160 can train the models 120 and/or 140 based on a set of training data 162. The training data 162 can include, for example, data used for supervised training (e.g., data labeled with expected outputs) and/or unsupervised training (e.g., batches of unlabeled data) and/or any other suitable training regime, or combination thereof.

In some implementations, if the user has provided consent, the training examples can be provided by the user computing device 102. Thus, in such implementations, the model 120 provided to the user computing device 102 can be trained by the training computing system 150 on user-specific data received from the user computing device 102. In some instances, this process can be referred to as personalizing the model.

The model trainer 160 includes computer logic utilized to provide desired functionality. The model trainer 160 can be implemented in hardware, firmware, and/or software controlling a general purpose processor. For example, in some implementations, the model trainer 160 includes program files stored on a storage device, loaded into a memory and executed by one or more processors. In other implementations, the model trainer 160 includes one or more sets of computer-executable instructions that are stored in a tangible computer-readable storage medium such as RAM hard disk or optical or magnetic media.

The network 180 can be any type of communications network, such as a local area network (e.g., intranet), wide area network (e.g., Internet), or some combination thereof and can include any number of wired or wireless links. In general, communication over the network 180 can be carried via any type of wired and/or wireless connection, using a wide variety of communication protocols (e.g., TCP/IP, HTTP, SMTP, FTP), encodings or formats (e.g., HTML, XML), and/or protection schemes (e.g., VPN, secure HTTP, SSL).

FIG. 1A illustrates one example computing system that can be used to implement the present disclosure. Other computing systems can be used as well. For example, in some implementations, the user computing device 102 can include the model trainer 160 and the training dataset 162. In such implementations, the models 120 can be both trained and used locally at the user computing device 102. In some of such implementations, the user computing device 102 can implement the model trainer 160 to personalize the models 120 based on user-specific data.

Figure 1B:
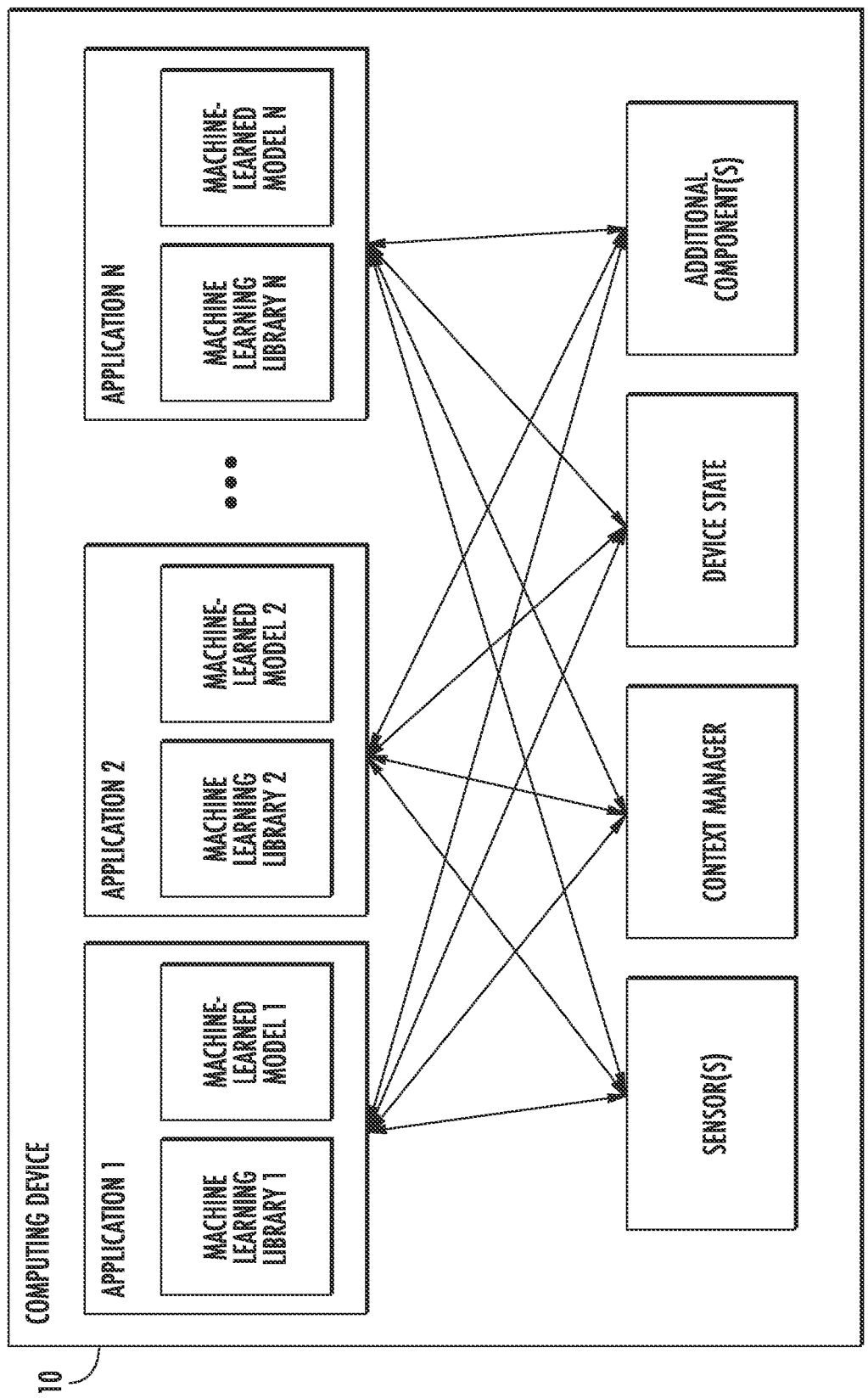
FIG. 1B depicts a block diagram of an example computing device according to example embodiments of the present disclosure.

FIG. 1B depicts a block diagram of an example computing device 10 that performs according to example embodiments of the present disclosure. The computing device 10 can be a user computing device or a server computing device.

The computing device 10 includes a number of applications (e.g., applications 1 through N). Each application contains its own machine learning library and machine-learned model(s). For example, each application can include a machine-learned model. Example applications include a text messaging application, an email application, a dictation application, a virtual keyboard application, a browser application, etc.

As illustrated in FIG. 1B, each application can communicate with a number of other components of the computing device, such as, for example, one or more sensors, a context manager, a device state component, and/or additional components. In some implementations, each application can communicate with each device component using an API (e.g., a public API). In some implementations, the API used by each application is specific to that application.

Figure 1C:
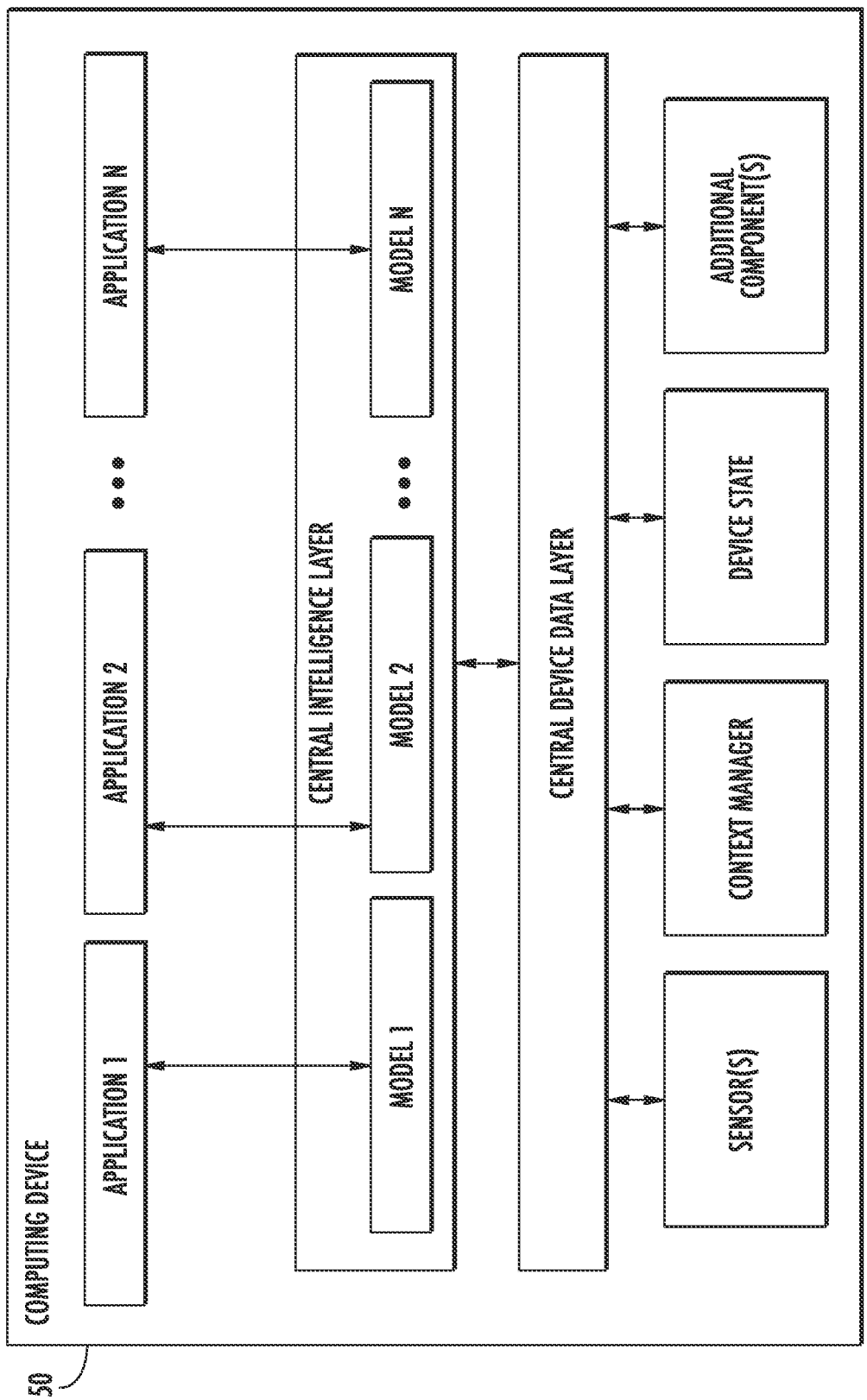
FIG. 1C depicts a block diagram of an example computing device according to example embodiments of the present disclosure.

FIG. 1C depicts a block diagram of an example computing device 50 that performs according to example embodiments of the present disclosure. The computing device 50 can be a user computing device or a server computing device.

The computing device 50 includes a number of applications (e.g., applications 1 through N). Each application is in communication with a central intelligence layer. Example applications include a text messaging application, an email application, a dictation application, a virtual keyboard application, a browser application, etc. In some implementations, each application can communicate with the central intelligence layer (and model(s) stored therein) using an API (e.g., a common API across all applications).

The central intelligence layer includes a number of machine-learned models. For example, as illustrated in FIG. 1C, a respective machine-learned model (e.g., a model) can be provided for each application and managed by the central intelligence layer. In other implementations, two or more applications can share a single machine-learned model. For example, in some implementations, the central intelligence layer can provide a single model (e.g., a single model) for all of the applications. In some implementations, the central intelligence layer is included within or otherwise implemented by an operating system of the computing device 50.

The central intelligence layer can communicate with a central device data layer. The central device data layer can be a centralized repository of data for the computing device 50. As illustrated in FIG. 1C, the central device data layer can communicate with a number of other components of the computing device, such as, for example, one or more sensors, a context manager, a device state component, and/or additional components. In some implementations, the central device data layer can communicate with each device component using an API (e.g., a private API).

Figure 2:
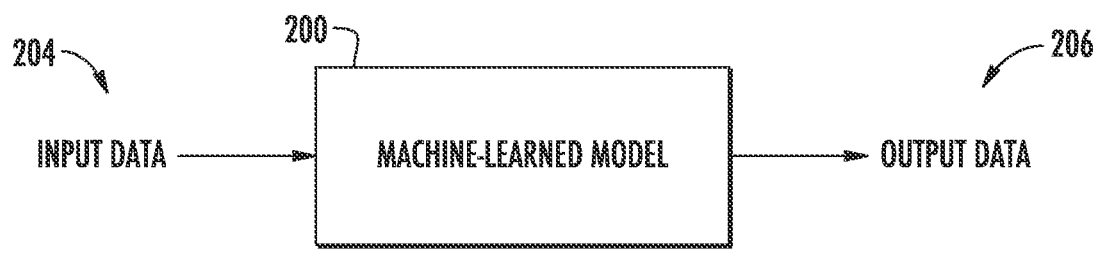
FIG. 2 depicts a block diagram of an example machine-learned model according to example embodiments of the present disclosure.

FIG. 2 depicts a block diagram of an example model 200 according to example embodiments of the present disclosure. In some implementations, the model 200 is trained to receive a set of input data 204 and, as a result of receipt of the input data 204, provide output data 206.

Example Data

Figure 3:
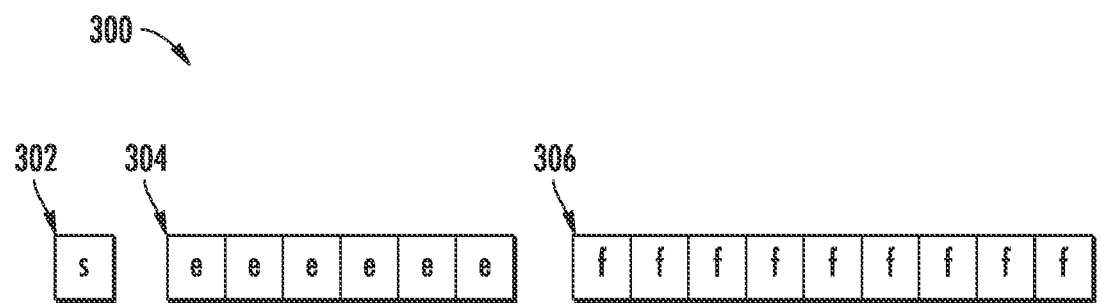
FIG. 3 depicts a block diagram of example data according to example embodiments of the present disclosure.

FIG. 3 depicts a block diagram of example data 300 according to example embodiments of the present disclosure. For instance, the data 300 can be floating point data that can be compressed according to example aspects of the present disclosure. For instance, the data 300 can be a single entry in a vector including a plurality of entries. As one example, the data 300 can be representative of a parameter of a machine-learned model.

The data 300 includes a sign component 302, exponent component 304, and mantissa component 306. The data 300 is a 16-bit floating point number having one numeral in the sign component 302, six numerals in the exponent component 304, and nine numerals in the mantissa component 306 for the purposes of illustration. One of ordinary skill in the art will understand that data having any suitable number of numerals in each of the sign component 302, exponent component 304, and mantissa component 306 can be used in accordance with the present disclosure. For example, 32-bit floating point numbers having one, eight, and twenty-three numerals in the sign, exponent, and mantissa component, respectively, can be used in accordance with the present disclosure. As another example, 64-bit "double precision" floating point numbers having one, eleven, and fifty-two numerals in the sign, exponent, and mantissa component, respectively, can be used in accordance with the present disclosure.

Figure 4:
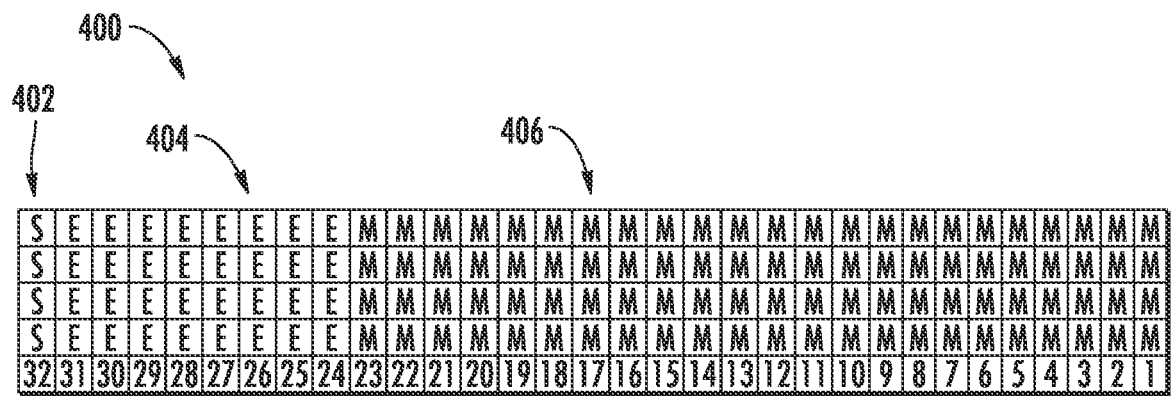
FIG. 4 depicts a block diagram of a plurality of example floating point data entries according to example embodiments of the present disclosure.

FIG. 4 depicts a block diagram of a plurality of example floating point data entries 400 according to example embodiments of the present disclosure. The entries 400 can include 32 bits. For instance, as illustrated in FIG. 4, the entries 400 can each include a sign bit 402, a plurality of exponent bits 404 (e.g., eight exponent bits), and a plurality of mantissa bits 406 (e.g., twenty-three mantissa bits) Four entries are depicted in FIG. 4, although any suitable number of entries may be included in accordance with example aspects of the present disclosure. For example, the entries 400 can include a tensor having thousands or even millions of entries.

Figure 5:
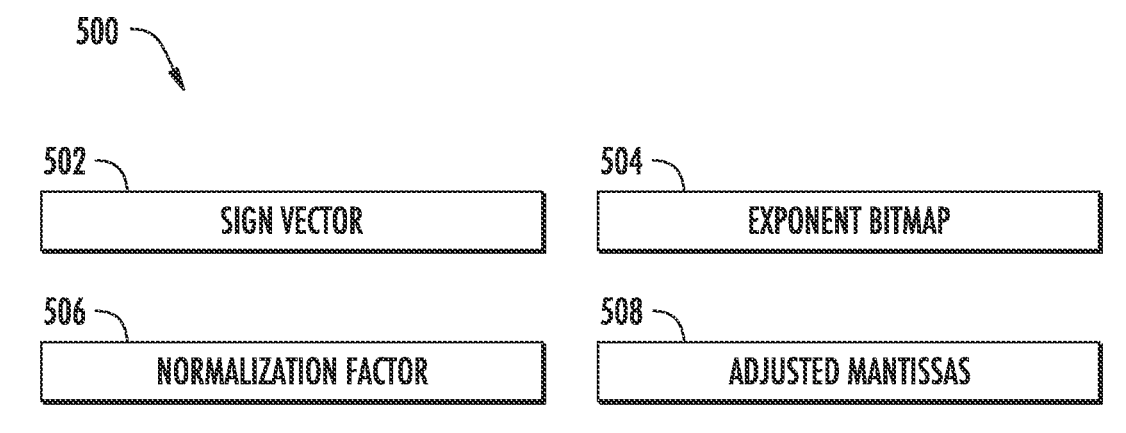
FIG. 5 depicts a block diagram of an example compressed representation of floating point data according to example embodiments of the present disclosure.

FIG. 5 depicts a block diagram of an example compressed representation 500 of floating point data according to example embodiments of the present disclosure. For example, the compressed representation 500 can represent the data 300 of FIG. 3 and/or the data 400 of FIG. 4, in addition to and/or alternatively to any other suitable floating point data. The compressed representation 500 can include a sign vector 502. The sign vector 502 can include a sign bit of each of a plurality of entries in floating point data.

The compressed representation 500 can include exponent bitmap 504. For instance, in some embodiments, the exponent bitmap 504 can include a unary representation of exponent bits of each of a plurality of normalized entries, as described herein. Additionally and/or alternatively, the exponent bitmap 504 can include a unary representation of offsets computed during an approximate L1 normalization process as described herein.

The compressed representation 500 can include a normalization factor 506. For instance, in some embodiments, the normalization factor 506 can be or can include a norm of floating point data to be compressed, such as an L1 norm. Additionally and/or alternatively, the normalization factor 506 can be or can include a normalization exponent k as described herein.

Figure 6:
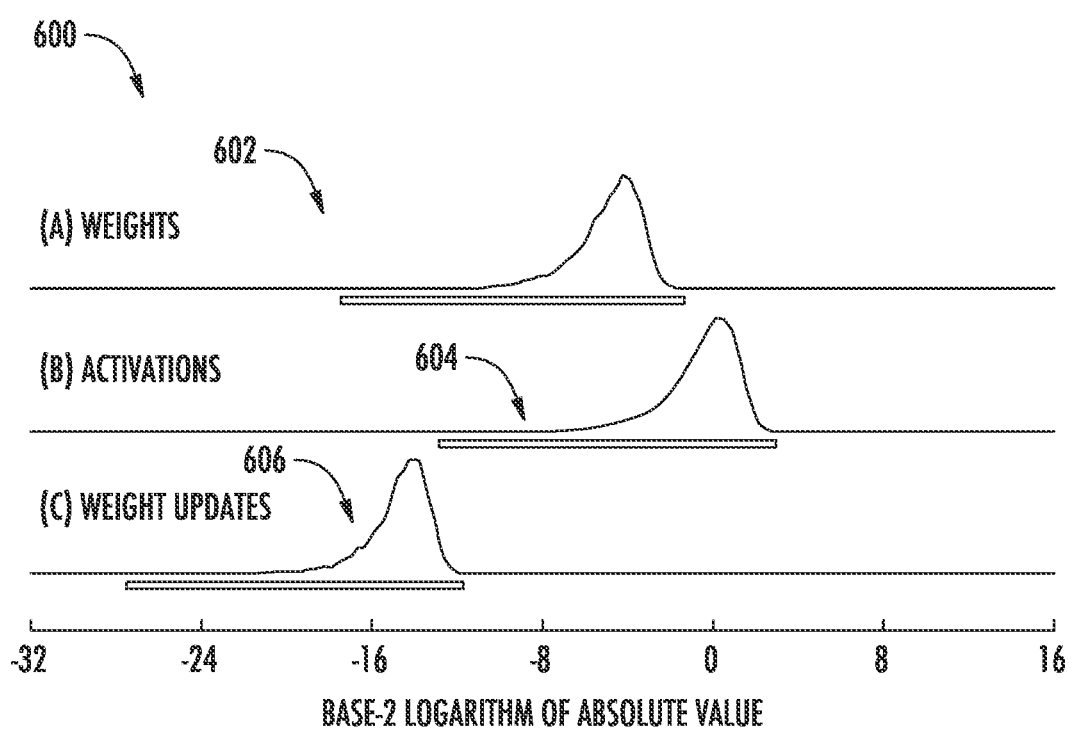
FIG. 6 depicts graphs of example weight distributions of an example machine-learned model according to example embodiments of the present disclosure.

FIG. 6 depicts graphs 600 of example weight distributions of an example machine-learned model according to example embodiments of the present disclosure. For instance, graphs 600 illustrate how parameters of a machine-learned model can exhibit a heavy-tailed distribution. As one example, plot 602 depicts an example heavy-tailed distribution of weights of an example machine-learned model. Additionally, plot 604 depicts an example heavy-tailed distribution of activations of an example machine-learned model. For instance, among other things, weights and activations can collectively define some or all portions of machine-learned model. Additionally, plot 606 depicts an example heavy-tailed distribution of weight updates of an example machine-learned model. For instance, the weight updates can be transmitted at some or all stages of training, and may desirably be compressible (e.g., in addition to and/or alternatively to the structural parameters including weights and activations).

Example Methods

Figure 7:
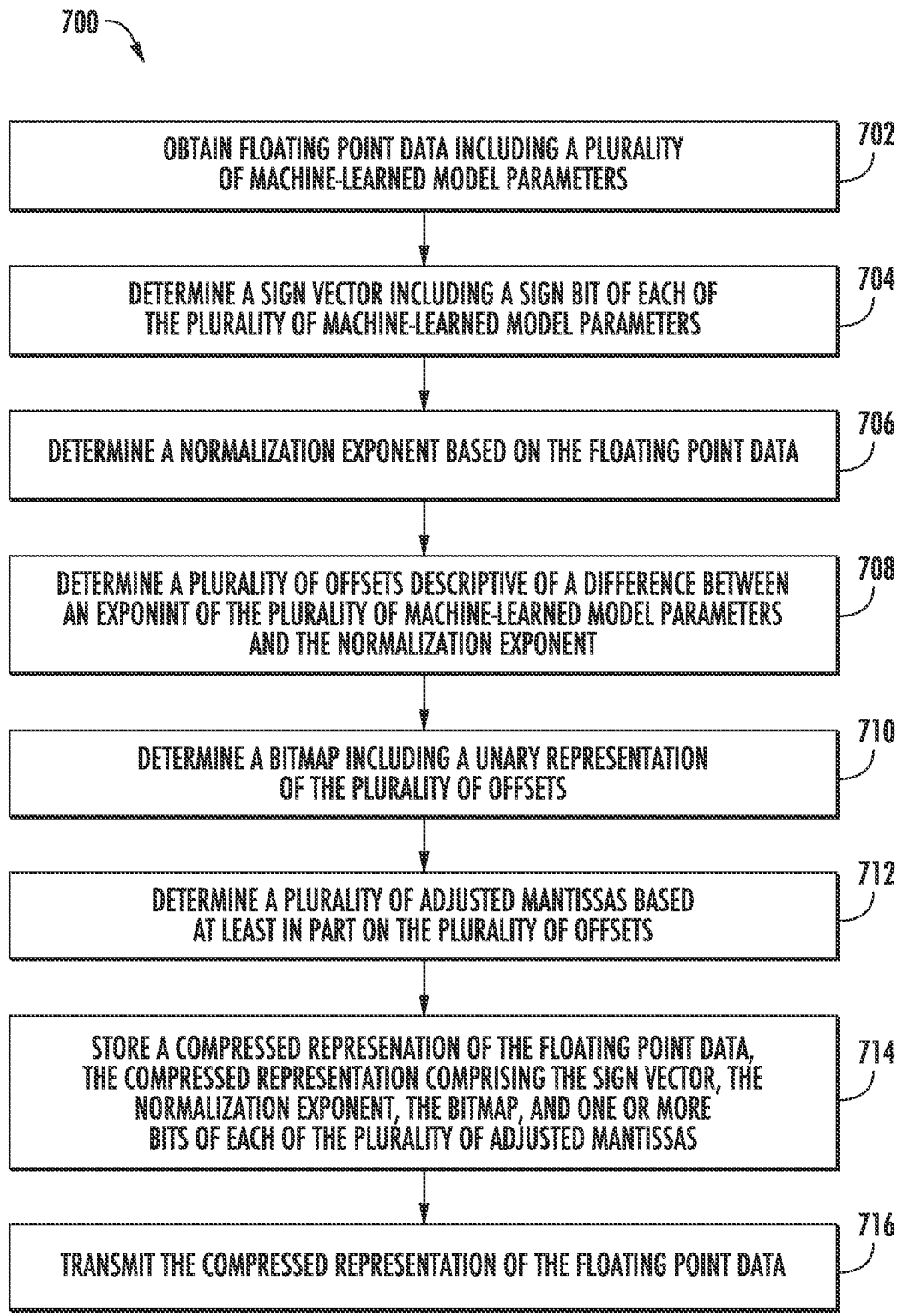
FIG. 7 depicts a flow chart diagram of an example method of compressing data according to example embodiments of the present disclosure.

FIG. 7 depicts a flow chart diagram of an example method to perform compression of floating point data according to example embodiments of the present disclosure. Although FIG. 7 depicts steps performed in a particular order for purposes of illustration and discussion, the methods of the present disclosure are not limited to the particularly illustrated order or arrangement. The various steps of the method 700 can be omitted, rearranged, combined, and/or adapted in various ways without deviating from the scope of the present disclosure.

At 702, a computing system having one or more computing devices can obtain floating point data. The floating point data can include a plurality of entries. For instance, the floating point data can be encoded as a vector and/or a tensor having a plurality of entries. In some implementations, the floating point data can be or can include parameters of a machine-learned model. For example, the floating point data can include structural parameters and/or training parameters of a machine-learned model.

At 704, the computing system can determine a sign vector including a sign bit of each of the plurality of entries. For instance, the sign vector can be stored as part of a compressed representation of the floating point data.

At 706, the computing system can determine a normalization factor based on the floating point data. In some embodiments, the normalization factor can be normalization exponent k. The normalization exponent can be defined such that two multiplied by an exponential sum with base two over a plurality of exponents respective to the plurality of machine-learned model parameters is less than or equal to a dimension of the tensor multiplied by two to the power of the normalization exponent. For example, the normalization exponent k can be defined such that $2\Sigma_i 2^{e_i} \leq d*2^k$, where $e_i$ is an exponent of an ith machine-learned model parameter and d is a length dimension of the tensor. For example, in some implementations, the tensor can be a vector and the dimension of the tensor can be a length of the vector.

At 708, the computing system can determine a plurality of offsets. For instance, the offsets can be descriptive of a difference between an exponent of a plurality of exponents respective to the plurality of machine-learned model parameters and a respective machine-learned model parameter of the plurality of machine-learned model parameters and the normalization exponent. In some embodiments, negative offsets can be rounded up to zero. For instance, the offsets can be represented as $\max(0, e_i - b)$.

At 710, the computing system can determine a bitmap. For instance, the bitmap can include a unary representation of the plurality of offsets. As one example, the bitmap can have two bits per entry in the floating point data (e.g., be a two-bit unary representation of the offsets).

At 712, the computing system can determine a plurality of adjusted mantissas based at least in part on the plurality of offsets. In some embodiments, determining the plurality of adjusted mantissas can include bit shifting a plurality of mantissas of the plurality of machine-learned model parameters by the plurality of offsets. For instance, the bit shifting can decrease a magnitude of the plurality of adjusted mantissas relative to a magnitude of the plurality of mantissas. In some cases, bit shifting operations can be easily implementable in hardware, which can be beneficial for processing large volumes of floating point data.

At 714, the computing system can store, in a memory of the computing system, a compressed representation of the floating point data. For instance, the compressed representation can include the sign vector, the normalization exponent, the bitmap, and one or more bits of each of the plurality of adjusted mantissas. For instance, in some embodiments, the number of bits of the plurality of adjusted mantissa included in the compressed representation can be based on a target number of bits per entry (e.g., per parameter) b. For instance, the one or more bits of each of the plurality of adjusted mantissas can be a subset of most significant bits of each of the plurality of adjusted mantissas, wherein the subset is sized based on a target number of bits per parameter. For example, if the sign vector includes one bit per entry and the bitmap includes two bits per entry, the adjusted mantissa may have b−3 bits.

In some embodiments, the method 700 can further include, at 716, transmitting the compressed representation of the floating point data. For instance, the compressed representation can be transmitted within the computing system and/or to an external computing system.

Figure 8:
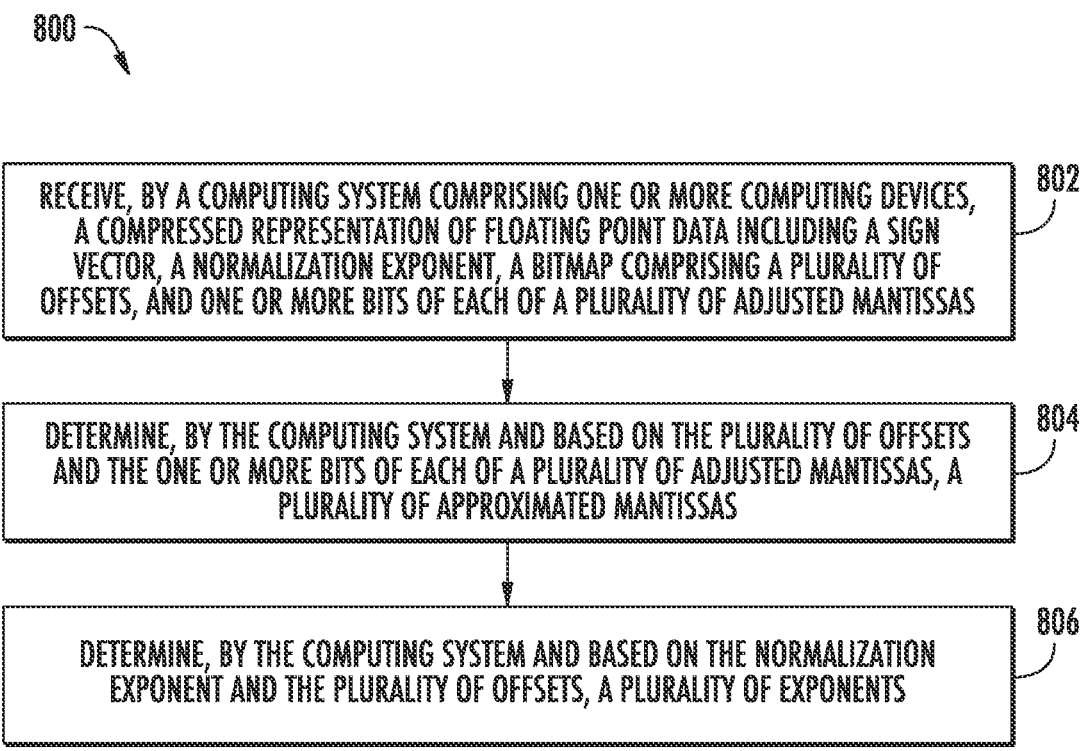
FIG. 8 depicts a flow chart diagram of an example method of decompressing data according to example embodiments of the present disclosure.

FIG. 8 depicts a flow chart diagram of an example method to perform compression of floating point data according to example embodiments of the present disclosure. Although FIG. 8 depicts steps performed in a particular order for purposes of illustration and discussion, the methods of the present disclosure are not limited to the particularly illustrated order or arrangement. The various steps of the method 800 can be omitted, rearranged, combined, and/or adapted in various ways without deviating from the scope of the present disclosure.

At 802, a computing system having one or more computing devices can receive a compressed representation of floating point data including a sign vector, a normalization exponent, a bitmap including a plurality of offsets, and one or more bits of each of a plurality of adjusted mantissas. In some embodiments, normalization factor can be or can include a normalization exponent such that two multiplied by an exponential sum with base two over a plurality of exponents respective to the plurality of machine-learned model parameters is less than or equal to a dimension of the tensor multiplied by two to the power of the normalization exponent. For example, the normalization exponent k can be defined such that $2\Sigma_i 2^{e_i} \leq d*2^k$, where $e_i$ is an exponent of an ith machine-learned model parameter and d is a length dimension of the tensor.

At 804, the computing system can determine, based on the plurality of offsets and the one or more bits of each of a plurality of adjusted mantissas, a plurality of approximated mantissas. For instance, the computing system can bit shift a plurality of mantissas of the plurality of machine-learned model parameters by the plurality of offsets. In some embodiments, the bit shifting can decrease a magnitude of the plurality of adjusted mantissas relative to a magnitude of the plurality of mantissas. For instance, the bit shifting can be performed to invert a bit shifting used to determine the plurality of adjusted mantissas to restore the original mantissas with a slight loss of precision.

At 806, the computing system can determine, based on the normalization factor and the subset of bits of each of the plurality of compressed entries, an approximated mantissa of each of the plurality of original entries. For example, the approximated mantissa can be determined by inverse normalizing the subset of bits and/or the exponent. In some embodiments, the plurality of original entries can include parameters of a machine-learned model.

Additionally and/or alternatively, in some implementations, the computing system can recombine the approximated mantissa, exponent, and/or sign vector into a floating point representation of the original entries. For example, the computing system can extract a sign bit from the sign vector for each of the original entries. Additionally, the computing system can concatenate the sign bit with the exponent and the approximated mantissa for each of the original entries.

Additional Disclosure

The technology discussed herein makes reference to servers, databases, software applications, and other computer-based systems, as well as actions taken and information sent to and from such systems. The inherent flexibility of computer-based systems allows for a great variety of possible configurations, combinations, and divisions of tasks and functionality between and among components. For instance, processes discussed herein can be implemented using a single device or component or multiple devices or components working in combination. Databases and applications can be implemented on a single system or distributed across multiple systems. Distributed components can operate sequentially or in parallel.

While the present subject matter has been described in detail with respect to various specific example embodiments thereof, each example is provided by way of explanation, not limitation of the disclosure. Those skilled in the art, upon attaining an understanding of the foregoing, can readily produce alterations to, variations of, and equivalents to such embodiments. Accordingly, the subject disclosure does not preclude inclusion of such modifications, variations and/or additions to the present subject matter as would be readily apparent to one of ordinary skill in the art. For instance, features illustrated or described as part of one embodiment can be used with another embodiment to yield a still further embodiment. Thus, it is intended that the present disclosure cover such alterations, variations, and equivalents.

What is claimed is:

1. A computer-implemented method of compressing floating point data of a machine-learned model into a compressed representation of the floating point data, the method comprising:
    obtaining, by a computing system comprising one or more computing devices, floating point data comprising a plurality of machine-learned model parameters encoded as a tensor;
    determining, by the one or more computing devices, a sign vector comprising a sign bit of each of the plurality of machine-learned model parameters;
    determining, by the one or more computing devices, a normalization exponent based on the floating point data;
    determining, by the one or more computing devices, a plurality of offsets, the offsets being descriptive of a difference between an exponent of a plurality of exponents respective to the plurality of machine-learned model parameters and a respective machine-learned model parameter of the plurality of machine-learned model parameters and the normalization exponent;
    determining, by the one or more computing devices, a bitmap comprising a unary representation of the plurality of offsets;
    determining, by the one or more computing devices, a plurality of adjusted mantissas based at least in part on the plurality of offsets; and
    storing, in a memory of the computing system, a compressed representation of the floating point data, the compressed representation comprising the sign vector, the normalization exponent, the bitmap, and one or more bits of each of the plurality of adjusted mantissas.

2. The computer-implemented method of claim 1, further comprising transmitting, by the one or more computing devices, the compressed representation of the floating point data.

3. The computer-implemented method of claim 1, wherein the floating point data comprises structural parameters of a machine-learned model.

4. The computer-implemented method of claim 1, wherein the floating point data comprises training parameters of a machine-learned model.

5. The computer-implemented method of claim 1, wherein two multiplied by an exponential sum with base two over the plurality of exponents respective to the plurality of machine-learned model parameters is less than or equal to a dimension of the tensor multiplied by two to the power of the normalization exponent.

6. The computer-implemented method of claim 5, wherein the tensor comprises a vector, and wherein the dimension of the tensor comprises a length of the vector.

7. The computer-implemented method of claim 1, wherein the one or more bits of each of the plurality of adjusted mantissas comprises a subset of most significant bits of each of the plurality of adjusted mantissas, and wherein the subset is sized based on a target number of bits per parameter.

8. The computer-implemented method of claim 7, wherein the subset of most significant bits comprises b−3 bits for each of the plurality of machine-learned model parameters, where b is the target number of bits per parameter.

9. The computer-implemented method of claim 1, further comprising, for each of the plurality of machine-learned model parameters:
   determining, by the one or more computing devices, that the parameter comprises an exponent greater than zero; and
   in response to determining that the parameter comprises an exponent greater than zero, storing an additional bit in place of a most significant bit of the parameter in the compressed representation.

10. The computer-implemented method of claim 1, wherein determining the plurality of adjusted mantissas comprises bit shifting a plurality of mantissas of the plurality of machine-learned model parameters by the plurality of offsets.

11. The computer-implemented method of claim 10, wherein the bit shifting decreases a magnitude of the plurality of adjusted mantissas relative to a magnitude of the plurality of mantissas.

12. The computer-implemented method of claim 1, wherein negative offsets of the plurality of offsets are rounded up to zero.

13. A computer-implemented method of decompressing floating point data from a compressed representation of the floating point data, the method comprising:
   receiving, by a computing system comprising one or more computing devices, a compressed representation of floating point data comprising a sign vector, a normalization exponent, a bitmap comprising a plurality of offsets, and one or more bits of each of a plurality of adjusted mantissas;
   determining, by the computing system and based on the plurality of offsets and the one or more bits of each of a plurality of adjusted mantissas, a plurality of approximated mantissas;
   determining, by the computing system and based on the normalization exponent and the plurality of offsets, a plurality of exponents.

14. The computer-implemented method of claim 13, wherein determining the plurality of approximated mantissas comprises bit shifting the plurality of adjusted mantissas by the plurality of offsets.

15. The computer implemented method of claim 14, wherein the bit shifting increases a magnitude of the plurality of approximated mantissas relative to a magnitude of the plurality of adjusted mantissas.

16. The computer-implemented method of claim 13, wherein two multiplied by an exponential sum with base two over the plurality of exponents is less than or equal to a dimension of a tensor representation of the floating point data multiplied by two to the power of the normalization exponent.

17. A computing system configured to compress floating point data, the computing system comprising:
   one or more processors; and
   one or more non-transitory computer-readable media that store instructions that, when executed by the one or more processors, cause the computing system to perform operations, the operations comprising:
      obtaining floating point data comprising a plurality of machine-learned model parameters encoded as a tensor;
      determining a sign vector comprising a sign bit of each of the plurality of machine-learned model parameters;
      determining a normalization exponent based on the floating point data;
      determining a plurality of offsets, the offsets being descriptive of a difference between an exponent of a plurality of exponents respective to the plurality of machine-learned model parameters and a respective machine-learned model parameter of the plurality of machine-learned model parameters and the normalization exponent;
      determining a bitmap comprising a unary representation of the plurality of offsets;
      determining a plurality of adjusted mantissas based at least in part on the plurality of offsets; and
      storing a compressed representation of the floating point data, the compressed representation comprising the sign vector, the normalization exponent, the bitmap, and one or more bits of each of the plurality of adjusted mantissas.

18. The computing system of claim 17, wherein the floating point data comprises structural parameters of a machine-learned model.

19. The computing system of claim 17, wherein the floating point data comprises training parameters of a machine-learned model.

20. The computing system of claim 17, wherein two multiplied by an exponential sum with base two over the plurality of exponents respective to the plurality of machine-learned model parameters is less than or equal to a dimension of the tensor multiplied by two to the power of the normalization exponent.

* * * * *